US009240527B2

(12) United States Patent
Song et al.

(10) Patent No.: US 9,240,527 B2
(45) Date of Patent: Jan. 19, 2016

(54) SUBMOUNT, OPTICAL MODULE PROVIDED WITH SUBMOUNT, AND SUBMOUNT MANUFACTURING METHOD

(71) Applicant: Advanced Photonics, Inc., Ota-Ku, Tokyo (JP)

(72) Inventors: Xueliang Song, Ota-Ku (JP); Foo Cheong Yit, Ota-ku (JP); Katsumasa Horiguchi, Ota-ku (JP); Shurong Wang, Ota-ku (JP)

(73) Assignee: Advanced Photonics, Inc., Tokyo (JP)

( * ) Notice: Subject to any disclaimer, the term of this patent is extended or adjusted under 35 U.S.C. 154(b) by 0 days.

(21) Appl. No.: 14/479,114

(22) Filed: Sep. 5, 2014

(65) Prior Publication Data

US 2015/0050759 A1 Feb. 19, 2015

Related U.S. Application Data

(62) Division of application No. 13/375,455, filed as application No. PCT/JP2010/059310 on Jun. 2, 2010, now abandoned.

(30) Foreign Application Priority Data

Jun. 5, 2009 (JP) .................................. 2009-135759

(51) Int. Cl.
*H01L 33/48* (2010.01)
*G02B 6/42* (2006.01)
(Continued)

(52) U.S. Cl.
CPC ............ *H01L 33/486* (2013.01); *G02B 6/4201* (2013.01); *H01L 31/0203* (2013.01);
(Continued)

(58) Field of Classification Search
IPC ....................................................... H01L 33/486
See application file for complete search history.

(56) References Cited

U.S. PATENT DOCUMENTS 5,535,296 A 7/1996 Uchida
5,882,949 A * 3/1999 Okazaki .......................... 438/26
(Continued)

FOREIGN PATENT DOCUMENTS

JP 1-168171 A 7/1989
JP 3-184384 A 8/1991
(Continued)

OTHER PUBLICATIONS

International Search Report mailed Sep. 21, 2010, issued in corresponding International Application No. PCT/JP2010/059310, filed Jun. 2, 2010, 4 pages.
(Continued)

*Primary Examiner* — Matthew W Such
*Assistant Examiner* — Abul Kalam
(74) *Attorney, Agent, or Firm* — Christensen O'Connor Johnson Kindness PLLC

(57) ABSTRACT

In manufacturing a submount, a first electrode layer (12) is formed as a layer on the surface of a submount substrate (11); a side surface (122) of the first electrode layer (12) is formed on substantially the same plane as a side surface (112) of the submount substrate (11); and the side surface (122) of the first electrode layer (12) is a connection surface for creating an electrical connection with the first electrode layer (12). By making the first electrode layer (12) sufficiently thick, the surface area of the side surface (122) can be made sufficiently large to allow, for example, wire bonding using the side surface (122). Further, components such as an optical element (14) can be protected by a sealing material (16).

2 Claims, 13 Drawing Sheets

(51) Int. Cl.
*H01L 33/54* (2010.01)
*H01S 5/022* (2006.01)
*H01L 31/0203* (2014.01)
*H01L 31/18* (2006.01)
*H01L 25/075* (2006.01)
*H01L 33/62* (2010.01)

(52) U.S. Cl.
CPC ............... *H01L31/18* (2013.01); *H01L 33/54* (2013.01); *H01S 5/02236* (2013.01); *H01S 5/02284* (2013.01); *H01L 25/0753* (2013.01); *H01L 33/62* (2013.01); *H01L 2224/48137* (2013.01); *H01L 2924/3011* (2013.01); *H01L 2933/0033* (2013.01); *H01S 5/02248* (2013.01); *Y10T 156/1052* (2015.01); *Y10T 156/1082* (2015.01)

(56) References Cited

U.S. PATENT DOCUMENTS

| | | |
|---|---|---|
| 6,451,628 B1 | 9/2002 | Tani |
| 6,833,566 B2 | 12/2004 | Suchiro |
| 8,113,724 B2 | 2/2012 | Terada |
| 2002/0070449 A1 | 6/2002 | Yagi |
| 2002/0109074 A1 | 8/2002 | Uchida |
| 2002/0163006 A1* | 11/2002 | Yoganandan et al. .......... 257/81 |
| 2007/0003194 A1 | 1/2007 | Ueno |
| 2008/0224169 A1 | 9/2008 | Wu |
| 2009/0072256 A1 | 3/2009 | Park |
| 2010/0061684 A1 | 3/2010 | Terada |
| 2010/0084167 A1 | 4/2010 | Shim |

FOREIGN PATENT DOCUMENTS

| | | |
|---|---|---|
| JP | 8-298345 A | 11/1996 |
| JP | 9-51053 A | 2/1997 |
| JP | 10-223817 A | 8/1998 |
| JP | 10-261820 A | 9/1998 |
| JP | 2001-141969 A | 5/2001 |
| JP | 2001-168393 A | 6/2001 |
| JP | 2002-14258 A | 1/2002 |
| JP | 2007-158009 A | 6/2007 |
| JP | 2008-10486 A | 1/2008 |
| JP | 2008-10837 A | 1/2008 |
| JP | 2008-218678 A | 9/2008 |
| JP | 2008-235469 A | 10/2008 |
| JP | 2009-71264 A | 4/2009 |

OTHER PUBLICATIONS

Office Action mailed Mar. 17, 2015, issued in corresponding Japanese Patent Application No. 2014-015077, filed Jan. 30, 2014, 3 pages.

* cited by examiner

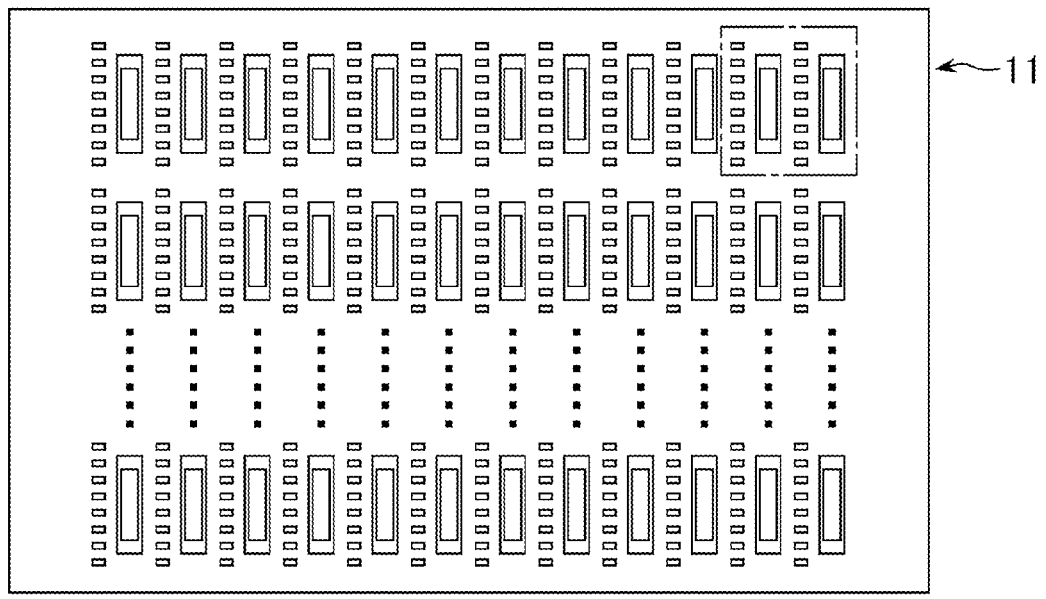
*Fig.10.*
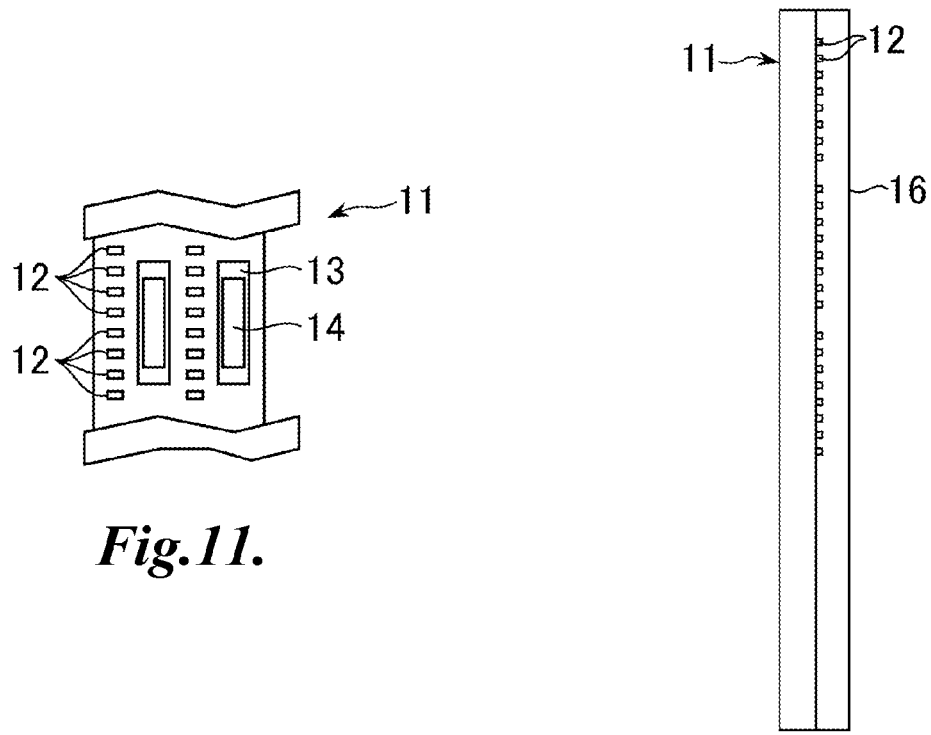
*Fig.11.*
*Fig.12.*

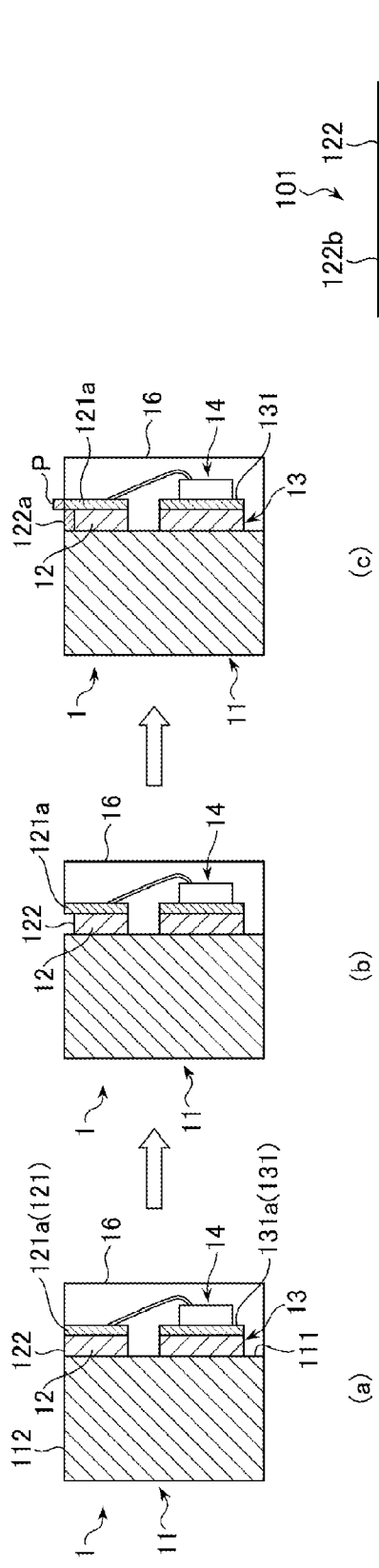
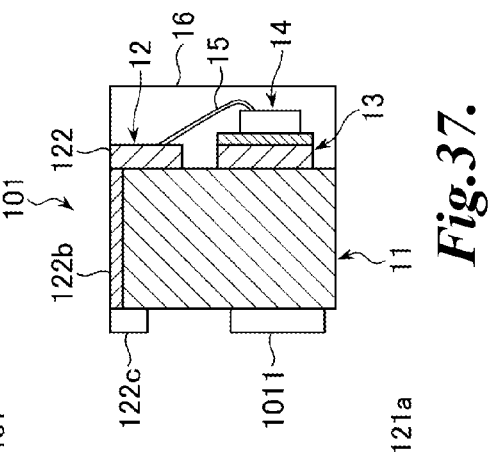
Fig.37.
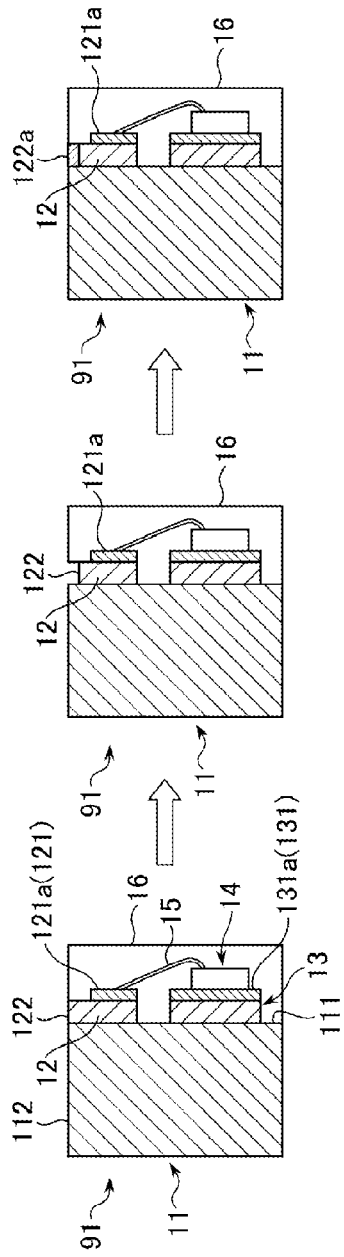
Fig.35.
Fig.36.

SUBMOUNT, OPTICAL MODULE PROVIDED WITH SUBMOUNT, AND SUBMOUNT MANUFACTURING METHOD

CROSS-REFERENCES TO RELATED APPLICATIONS

This application is a division of U.S. application Ser. No. 13/375,455, filed Feb. 15, 2012, which is the National Stage of International Application No. PCT/JP2010/059310, filed Jun. 2, 2010, the disclosures of which are hereby expressly incorporated by reference herein in their entirety.

TECHNICAL FIELD

The present invention relates to a submount that can be used to mount a component for carrying out reception or transmission of light on a substrate.

BACKGROUND ART

In patent publication 1 and patent publication 2 described below, there is disclosed a submount for an LED-array as a light emitting element. An outline of this structure will be described using FIG. 1 and FIG. 2.

The submount 100 of this related art comprises a submount substrate 101, a wiring electrode 102, and a light emitting element electrode 103. The wiring electrode 102, as shown in FIG. 1, is formed across a surface (the right side surface in FIG. 1) and a side surface (upper surface in FIG. 1) of the submount substrate 101. Also, as shown in FIG. 2, a light emitting element 104 is mounted on the electrode 103.

An example of an optical module using this type of submount 100 is shown in FIG. 2. With this example, the submount 100 is mounted on a module substrate 200. An IC 300 is also mounted on the module substrate 200. The IC 300 is for driving a light emitting element 104 causing it to emit light.

With the example of FIG. 2, the optical axis of light emitted from the light emitting element 104 is arranged parallel to the surface of the substrate 200. By doing this, it is possible to arrange an optical fiber for receiving light in parallel on the substrate 200, which makes it possible to miniaturize the overall optical module including the optical fiber (refer to patent publication 3 below).

With this related art optical module, a connection is made between the IC 300 and a wiring electrode 102 using a bonding wire 400. Also, a connection is made between the wiring electrode 102 and the light emitting element 104 using a bonding wire 500.

In this way, with this related art technology it is possible to electrically connect a drive IC 300 and a light emitting element 104.

Also, with this related art technology, since a wiring electrode 102 is formed on a side surface of a submount substrate 101, it is possible to connect a bonding wire 400 to the wiring electrode 102. The bonding wire 500 for connecting the wiring electrode 102 and the light emitting element 104 is wired before attaching the submount substrate 101 to the module substrate 200.

Incidentally, with the conventional submount 100 shown in FIG. 1 and FIG. 2, it is necessary for the wiring electrode 102 to be formed straddling a side surface and the main surface of the sub mount substrate 101. Accordingly, a bent section that is bent at about 90 degrees is formed in the wiring electrode 102. With an electrode 102 of this type of structure there is a possibility of rupture to this bend section, and there is a possibility that manufacturing process yield will become bad.

Also, in order to form this type of structure a comparatively complicated processes required, and there is a problem of poor manufacturing efficiency.

CITATION LIST

Patent Literature

Patent Literature 1: publication of patent application No. Hei. 3-184384 (FIG. 1 and FIG. 2)

Patent literature 2: publication of patent application number 2001-141969 (FIG. 5)

Patent literature 3: publication of patent application number 2008-10837 (FIG. 11)

SUMMARY OF THE INVENTION

Technical Problem

The present invention has been conceived in view of the above-described circumstances.

One object of the present invention is to provide the technology for simplifying the structure of a submount, and for improving manufacturing efficiency of such a submount.

Solution to the Problem

The present invention is comprised of the disclosure of any of the following aspects.

(Aspect 1)

A sub mount comprising a sub mount substrate, a first electrode layer, an optical element, and a sealing member, the sub mount substrate comprising a surface, and a side surface adjacent to this surface, the first electrode layer being formed by laminating on the surface of the sub mount substrate, a side surface of the first electrode layer being formed straddling from the surface of the sub mount substrate to the surface of the first electrode layer, the side surface of the first electrode layer being formed on substantially the same plane as the side surface of the sub mount substrate, the side surface and the surface of the first electrode layer constituting contact surfaces for electrically connecting to this first electrode layer, the surface of the first electrode layer and the optical element being electrically connected, the sealing member covering the surface of the first electrode layer and the surface of the optical element, and the sealing member exposing the side surface of the first electrode layer.

By making the first electrode layer sufficiently thick, it becomes possible to perform electrical connection using the side surface of the first electrode layer. Also, since the side surface of the first electrode layer is formed on substantially the same plane as the side surface of the submount substrate, it is possible to easily perform connection that uses connection means such as wire bonding, solder or conductive paste. Specifically, "substantially the same plane" can be to an extent that would not inhibit connection using connection means such as wire bonding, solder or conductive paste. For example, it is possible for the side surface of the first electrode layer to bulge somewhat compared to the side surface of the submount substrate.

Also, since the surface of the first electrode layer, apart from the side surface of the first electrode layer, and the surface of the optical element are covered by the sealing member, it is possible to protect components such as the optical element during operations such as manufacture of the submount itself, and attachment of the submount substrate to another substrate. Also, since the sealing member leaves the side surface of the first electrode layer exposed, it is possible to easily carry out connection operations that use this first electrode layer.

Further, the term electrical connection in the above description is not limited to direct connection such as wire bonding, and also has a meaning including indirect connection such as through an IC for example.

(Aspect 2)

The submount disclosed in aspect 1, further comprising a second electrode layer, the second electrode layer being formed on the surface of the submount substrate, and the optical element being mounted on the second electrode layer.

(Aspect 3)

The submount disclosed in aspect 2, wherein the submount substrate is provided with a via hole and a heat dissipator, the heat dissipator is arranged on a rear surface side of the submount substrate in a state exposed to the outside, and the via hole thermally connects the second electrode layer and the heat dissipator.

(Aspect 4)

The submount disclosed in any one of aspects 1-3, wherein the side surface of the first electrode layer is to be connected to one end of a bonding wire.

By using the heat dissipator, heat generated from the optical element can be radiated to the outside via the heat dissipator.

(Aspect 5)

The submount disclosed in any one of aspects 1-3, wherein the side surface of the first electrode layer is to be connected to an electrode of a module substrate.

(Aspect 6)

The submount disclosed in aspect 2, wherein a drive element for driving the optical elements, or an amplifying element for amplifying output from the optical element, is mounted on the second electrode layer.

The drive element for driving an optical element, or the amplifying element for amplifying output from the optical element, is for example, an IC for driving an optical element.

(Aspect 7)

The submount disclosed in aspect 1, further comprising a second electrode layer, the second electrode layer being formed on the surface of the submount substrate, and a silicon photonics IC being mounted on the second electrode layer.

(Aspect 8)

The sub mount disclosed in aspect 2 or aspect 7, wherein the sealing member also exposes a side surface of the second electrode layer. It is possible to perform electrical connection to the second electrode layer using the exposed side surface of the second electrode layer.

(Aspect 9)

An optical module provided with the submount of any one of aspects 1-8, and a module substrate upon which the submount is mounted.

(Aspect 10)

A manufacturing method for a submount comprising the following steps:

(1) a step of laminating a first conductive layer on a surface of a submount substrate;

(2) a step of forming the first conductive layer in a predetermined shape using a mask pattern;

(3) a step of sealing a surface of the first conductive layer and a surface of the optical element using a sealing member; and (4) a step of forming a side surface, that is formed on substantially the same plane as the side surface of the submount substrate and has been exposed to the outside, on the first conductive layer, by cutting the first conductive layer in the thickness direction together with the submount substrate.

According to this manufacturing method, it is possible to manufacture the submount disclosed in aspects 1-8 efficiently. Also since a first conductive layer is formed using a mask pattern, positional precision of the first conductive layer is improved, and it is made easy to increase the integration density of the first conductive layer.

Further, since a side surface of the first conductive layer is exposed by a cutting operation after sealing the surface of the first conductive layer and a surface of the optical element using a sealing member, it is possible to protect components such as the optical element using the sealing member even during cutting operations. Also, since the side surface of the first conductive layer is exposed by cutting, it is possible to increase the manufacturing efficiency of the submount.

(Aspect 11)

A manufacturing method for a submount comprising the following steps:

(1) a step of laminating a first conductive layer on a surface of a submount substrate;

(2) a step of forming the first conductive layer in a predetermined shape by machining;

(3) a step of sealing a surface of the first conductive layer and a surface of the optical element using a sealing member; and (4) a step of forming a side surface, that is formed on substantially the same plane as the side surface of the submount substrate and has been exposed to the outside, on the first conductive layer, by cutting the first conductive layer in the thickness direction together with the submount substrate.

With the present invention, a side surface of the first conductive layer is preferably made sufficiently wide, and in order to do this the thickness of the first conductive layer is preferably made sufficiently thick. In this case, if the shape of the first conductive layer is formed by etching, it is sometimes difficult to obtain sufficient machining precision. Conversely, according to the method of this aspect, even in the case where the first conductive layer is thick, there is an advantage that there is no deterioration in the machining precision of the first conductive layer. Machining here is machining using a dicer or a miller, for example, but is not restricted thereto, and can also mean machining by cutting.

(Aspect 12)

A manufacturing method for the submount disclosed in aspect 10 or aspect 11, further comprising the following step:

(5) after step (4), forming a thin film on the side surface of the first electrode layer in order to carry out electrical connection from the outside to this first electrode layer.

Effect of the Invention

According to the present invention, it is possible to provide a submount that is easy to manufacture and has good manufacturing efficiency.

Also, according to the present invention, it is possible to provide an optical module that uses this submount.

Further, according to the present invention, it is possible to provide a method for manufacturing this submount efficiently and with high precision.

BRIEF DESCRIPTION OF THE DRAWINGS

FIG. 10 is an explanatory drawing for describing a manufacturing method for a submount substrate of the present invention, and shows a plan view of the submount substrate.

FIG. 11 is an expanded view of main parts of FIG. 10.

FIG. 12 is an explanatory drawing for describing a manufacturing method for a submount substrate of the present invention, and shows a side view of the submount substrate.

FIG. 35 is an explanatory drawing for describing conditions of a manufacturing method for a submount substrate of a ninth embodiment.

FIG. 36 is an explanatory drawing for describing a manufacturing method for a submount substrate of the ninth embodiment.

FIG. 37 is a cross-sectional drawing of a submount of a tenth embodiment.

EMBODIMENTS FOR CARRYING OUT THE INVENTION

First Embodiment

A submount of a first embodiment of the present invention, and an optical module using the submount, will be described based on the attached drawings FIG. 3-FIG. 9.

Figure 7:
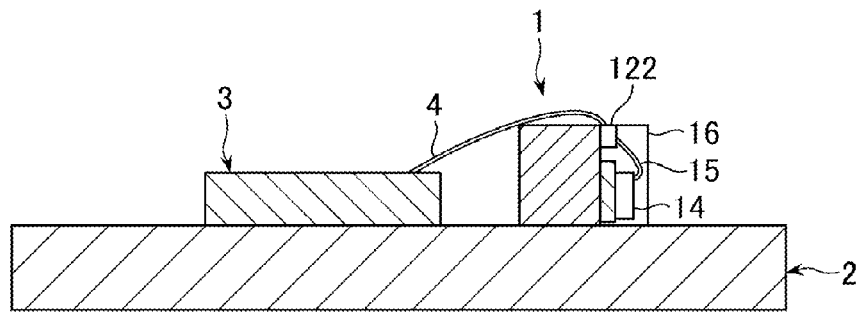
FIG. 7 is an explanatory drawing for describing an example of mounting the submount of FIG. 3 on a module substrate.

An optical module of this embodiment comprises a submount 1, a module substrate 2, and an IC 3 as key elements (refer to FIG. 7).

(Submount Structure)

Figure 1:
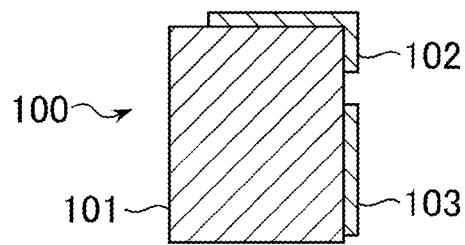
FIG. 1 is an explanatory drawing for describing the structure of a conventional submount.
Figure 2:
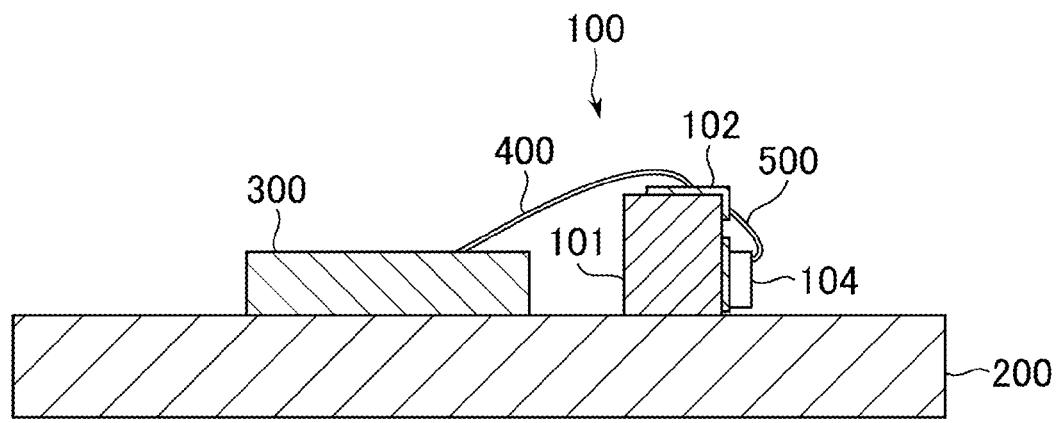
FIG. 2 is an explanatory drawing for describing examples of mounting the conventional submount on a module substrate.
Figure 3:
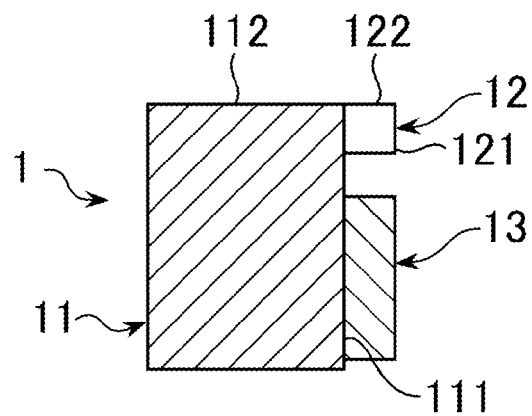
FIG. 3 is an explanatory drawing for describing a submount of a first embodiment of the present invention, and schematically shows a cross-section of a submount.
Figure 4:
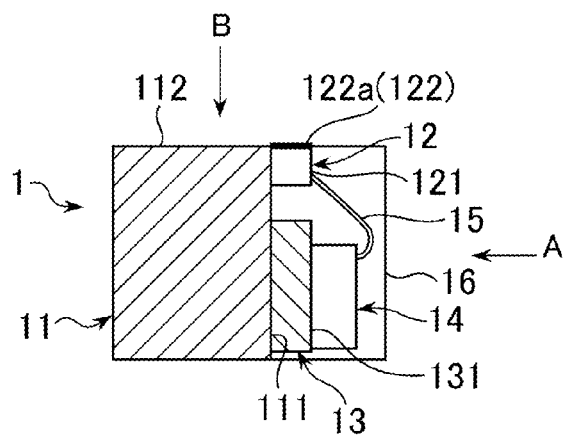
FIG. 4 is a cross-sectional drawing of the submount of the first embodiment of the present invention.

The submount 1 of this embodiment mainly comprises a submount substrate 11, a first electrode layer 12, a second electrode layer 13, an optical element 14 and a sealing member 16 (refer to FIG. 3 and FIG. 4). Mention of the sealing member 16 is omitted from FIG. 3.

The submount substrate 11 comprises a surface (right side surface in FIG. 3) 111, and a side surface (upper surface in FIG. 3) 112 adjacent to this surface 111. It is preferable to use a high insulation property material such as glass epoxy or ceramic as the material for the submount substrate 11.

Figure 5:
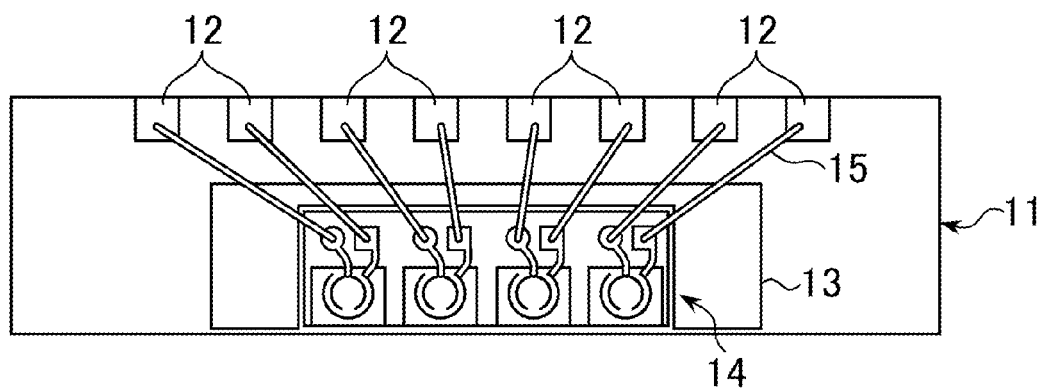
FIG. 5 is a perspective view in the direction of arrow A in FIG. 4.
Figure 6:
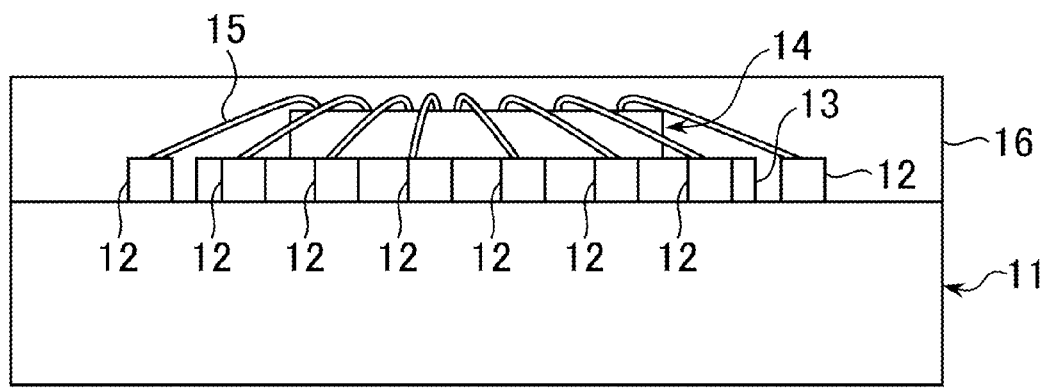
FIG. 6 is a perspective view in the direction of arrow B in FIG. 4.

The first electrode layer 12 is formed by laminating on the surface 111 of the submount substrate 11 (refer to FIG. 3 and FIG. 4). Also, as shown in FIG. 5 and FIG. 6, a plurality of first electrode layers 12 are arranged in an array shape positioned at intervals. In the description of this embodiment, unless particularly necessary, the plurality of first electrode layers will be grouped together and simply referred to as first electrode layer 12. One example of material of the first electrode layer 12 is a laminated structure of a Ni layer and a Au layer, but this is not restrictive as long as it is a material with good conductivity. This type of first electrode layer 12 can be produced using, for example, Ni/Au plating. Alternatively, it is possible to form the first electrode layer by pressure-joining copper foil to the surface of the submount substrate 11, and forming into a specified shape by etching (a manufacturing method will be described later). The first electrode layer 12 comprises a surface (right side surface in FIG. 3) 121, and a side surface (upper surface in FIG. 3) 122.

The side surface 122 of the first electrode layer 12 is formed spanning from the surface 111 of the submount substrate 11 to the surface 121 of the first electrode layer 12. The side surface 122 of the first electrode layer 12 is formed on substantially the same plane as the side surface 112 of the submount substrate 11, that is, the side surface 122 of the first electrode layer 12, and the side surface 112 of the submount substrate 11 are made substantially what is called "in-plane". Further, the side surface 122 of the first electrode layer 12 is regarded as a connection surface for performing electrical connection to this first electrode layer 12. Specifically, in order to facilitate wire bonding, a thin-film 122a (refer to FIG. 4) made of Ni/Au plate, for example, is formed on this side surface 122.

The second electrode layer 13, similarly to the first electrode layer 12, is formed on the surface 111 of the submount substrate 11 (refer to FIG. 3-FIG. 5). An array shaped optical element 14 for carrying out either reception or emission of light is mounted on the second electrode layer 13 (refer to FIG. 5 and FIG. 6). As a material for the second electrode layer 13 it is possible to use the same material as that of the first electrode layer 12. It is possible to use a light receiving element or a light emitting element as the optical element 14. As a light receiving element, it is possible to use an element that converts light to electricity, such as a PD (Photo Diode). As a light emitting element, it is possible to use an element that generates light using electrical power, such as an LED (Light Emitting Diode) or a VCSEL (Vertical Cavity Surface Emitting LASER). Unless particularly required, in the description of this embodiment a plurality of optical elements arranged in an array (for example, PDs and LEDs) will be grouped together and referred to as optical element 14. As the optical element 14 it is also possible to use a single element and not an array.

The optical element 14 and the first electrode layer 12 are electrically connected by means of a bonding wire 15 (refer to FIG. 4). It is also possible to electrically connect the first electrode layer 12 and the second electrode layer 13, using wire bonding or a wiring pattern.

The second electrode layer 13 and the optical element 14 are electrically connected. Specifically, an electrode (not shown) is formed on a bottom surface (surface facing the second electrode layer) of the optical element 14, and this electrode is connected to a surface 131 of the second electrode layer 13 by means of a connecting material (not shown) such as solder or conductive paste.

Further, as shown in FIG. 4 the first electrode layer 12, second electrode layer 13, optical element 14, and bonding wire 15, are sealed by the sealing member 16. However, the sealing member 16 is configured substantially not covering the side surface 122 of the first electrode layer 12. That is, by exposing this side surface 122 to the outside, it becomes possible to use for electrical connection. Also, with this configuration, it is possible to seal places that will constitute electrical connection points between the first electrode layer 12 and the second electrode layer 13 or the optical element 14 with the sealing member 16. It is possible to expose the side surface of the second electrode layer 13 for electrical connection.

Here, it is preferable for the sealing member 16 to transmit light that has been emitted from the optical element 14 or is incident on the optical element 14. Light wavelength bands used by a general optical fiber are the 850 nm band, the 1100 nm band, the 1310 nm band, and the 1550 nm band. As a material that is transparent with respect to light in these bands, there are, for example, silicon type, epoxy type and polyimide type resins, it is possible to use a material that hardens by means such as UV, heat or two component mixing. However, the material is not limited to these as long as it has practically sufficient degree of transparency with respect to the light used.

(Structure of Optical Module)

The module substrate 2 (refer to FIG. 7) can be constructed using the same material as that of the submount substrate 11. It is also possible to use a different material, however.

The IC 3 functions as a drive element for driving an optical element 14, or as an amplifying element for amplifying output from the optical element 14. This IC 3 is mounted on the surface of the module substrate 2 (refer to FIG. 7). In this embodiment, an IC 3 is respectively arranged in correspondence with each optical element 14. This type of IC arrangement can be the same as the related art, and so further description will be omitted.

One end of a bonding wire 4 is connected to the side surface 122 of the first electrode layer 12 (refer to FIG. 7). In this way, the IC 3 and the optical element 14 are electrically connected by means of the first electrode layer 12. Here, each IC 3 is respectively connected to the side surface 122 of each corresponding first electrode layer 12 by wire bonding.

Figure 8:
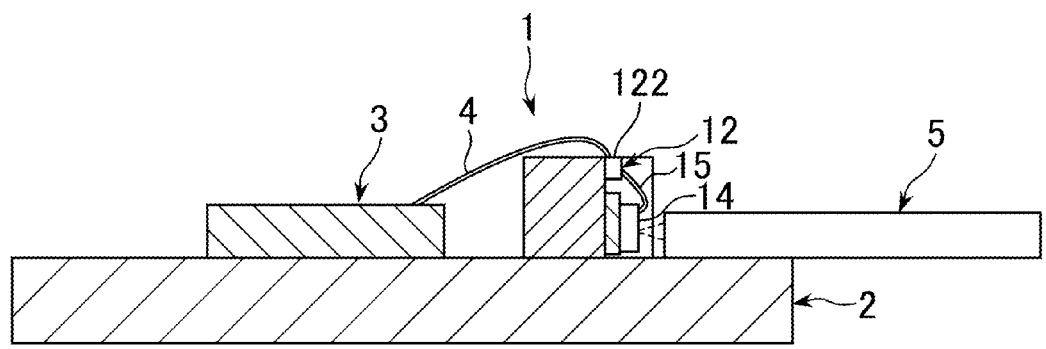
FIG. 8 is an explanatory drawing for describing an example of mounting an optical fiber on the submount of the first embodiment of the present invention.

Further, one end of an optical fiber 5 is arranged on the module substrate 2, facing the optical element 14 (refer to FIG. 8). The optical fiber 5 transmits light to the optical element 14 in the case where the optical element 14 is a light receiving element, and receives and conveys light from the optical element 14 in the case where the optical element 14 is a light emitting element.

(Operation of this Embodiment)

With the optical module of this embodiment, one end of the bonding wire 4 for connecting the IC 3 and the first electrode layer 12 can be connected using the side surface 122 of the first electrode layer 12.

Therefore, with the submount 1 of this embodiment there is no need to form an electrode extending in the side surface direction, as in a conventional submount. Accordingly, the submount 1 of this embodiment has the advantage that manufacture is simple, and there is no possibility of rupture to a bent section. According to this embodiment, therefore, it is possible to keep manufacturing cost of the submount 1 low.

Figure 9:
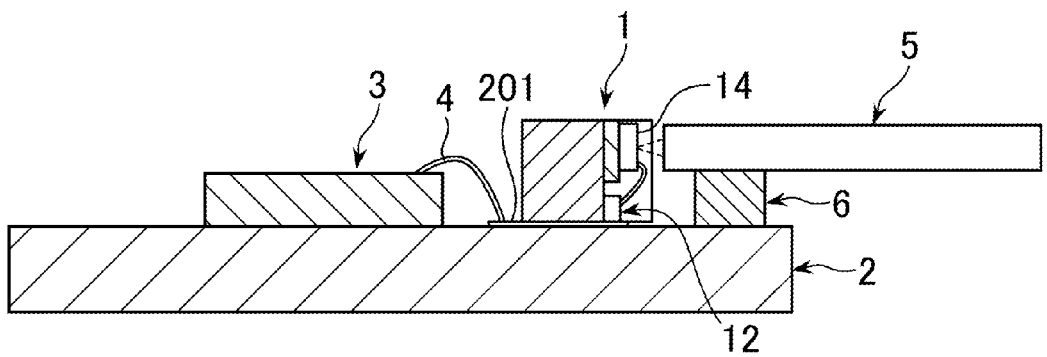
FIG. 9 is an explanatory drawing for describing another example of mounting an optical fiber on the submount of the first embodiment of the present invention.

In FIG. 8, the bonding wire 4 is directly connected to the first electrode layer 12, but it is also possible to connect indirectly, as shown in FIG. 9. With the example of FIG. 9, an electrode 201 is formed on the surface of the module substrate 2. The side surface 122 of the first electrode layer 12 is then connected to the electrode 201 by appropriate connection means such as solder or conductive paste. With this example, the bonding wire 4 is connected to the first electrode layer 12 by means of the electrode 201. With the example of FIG. 9, a base 6 for adjusting the height of the optical fiber 5 can also be used.

(Method of Manufacturing Submount)

Figure 13:
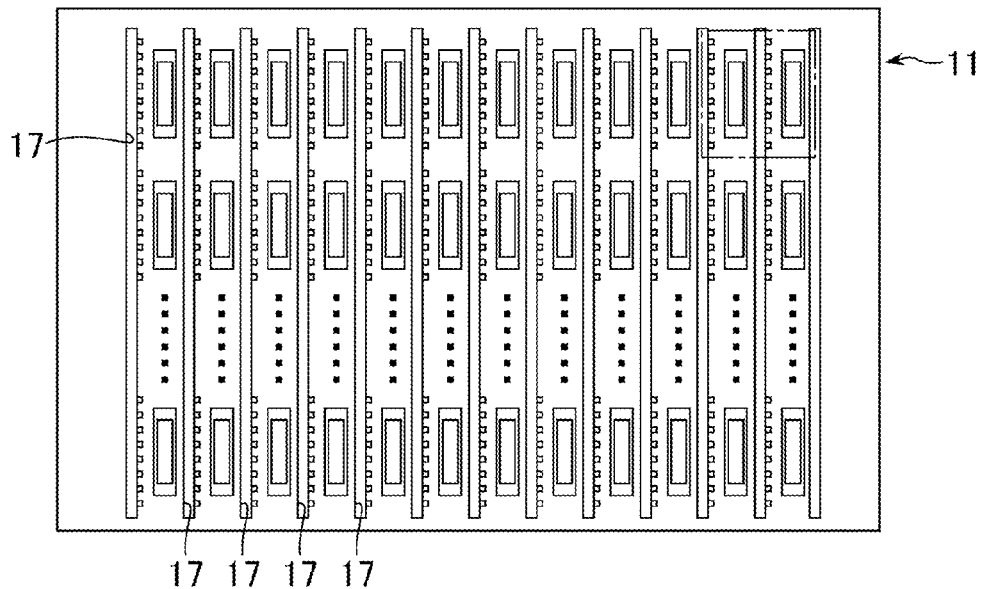
FIG. 13 is an explanatory drawing for describing a manufacturing method for a submount substrate of the present invention, and shows a plan view of a submount substrate having a slit formed therein.

Next, a manufacturing method for the submount of this embodiment will be described with reference to FIG. 10 to FIG. 14. First, a specified number of first conductive layers 12 and second electrode layers 13 are formed on the surface of the submount substrate 11 using a mask pattern (not shown). For example, it is possible to form these electrode layers by carrying out selective plating after arranging a mask pattern on the surface of the submount substrate 11. Alternatively, it is also possible to form these electrode layers by arranging a mask pattern after attaching copper foil to the surface of the submount substrate 11, and then removing unnecessary portions by etching. In FIG. 10 and FIG. 13, description of parts of the first conductive layers 12 and the second electrode layers 13 that are shown repeatedly is omitted. Only a part of the submount substrate 11 is shown enlarged in FIG. 11.

With this embodiment, since each electrode layer is formed using a mask pattern, there is the advantage that it is possible to form these electrode layers with a high degree of integration and positional precision.

Next, a plurality of optical elements 14 are respectively attached to the surface of the second electrode layer 13. These operations can be carried out at high speed and with high precision using a so-called multi-chip bonding process that uses a so-called die bonder (not shown). After that, a first electrode layer 12 and an optical element 14 are connected using a bonding wire 15. This operation can also be carried out at high speed using a wire bonder (not shown). As the size (thickness) of the second electrode layer 13, for example, it is possible to form to a thickness, in cross-section, of 50 to 150 μm.

Next, the whole of the surface 111 of the submount substrate 11 is covered by the sealing member 16 (refer to FIG. 12). With this embodiment, by covering the bonding wire 15 and the optical element 14, or electrical connection points, with the sealing member 16, it is possible to protect these from impacts from the outside. Also, by using the sealing member 16, it is possible to protect the bonding wire 15 and the optical element 14 against the adhesion of moisture or foreign bodies, and breakage caused by contact with foreign bodies.

Next, a slit 17 is formed in the submount substrate 11. The slit 17 is formed passing the submount substrate 11 and the sealing member 16. Further, the slit 17 is formed so as to cut away a part of the first electrode layer 12. Specifically, by forming the slit 17, it is possible to expose the side surface 122 of the first electrode layer 12 (refer to FIG. 3 and FIG. 4) to the outside. Formation of the slit 17 in this way can be carried out at comparatively high speed and with good precision using a so-called dicer. A dicer is a device for cutting a substrate with high precision using a cutter such as a diamond cutter, for example. It is possible to use a device that is hitherto known as this type of dicer.

With this embodiment, since the bonding wire 15 and optical element 14 are covered with the sealing member 16 before formation of the slit 17, it is possible to protect the bonding wire 15 and optical element 14 from impact at the time of slit formation. Also, in the process of slit formation using a dicer, cutting is carried out while injecting cutting water (cleaning water) to a sample. Because of the sealing member 16 there is the advantage that it is possible to protect the bonding wire 15 and the optical element 14 from the cutting water. Further, there is the advantage that it is possible to prevent swarf, that is produced during the cutting process with the dicer, from adhering to the optical element 14.

Further, with this embodiment, because the first electrode layer 12 is covered with the sealing member 16 before forming the slit 17 (refer to FIG. 12), there is the advantage that at the time of forming the slit 17 using the dicer, it is possible to form a flat surface without burrs arising in the vicinity of the side surface 122 of the first electrode layer 12. Specifically, with this embodiment, since a deburring operation can be omitted, it is possible to decrease bad connections, and more importantly it is possible to reduce the cost associated with deburring.

Also, with this embodiment, since a part of the first electrode layer 12 is cut away by forming the slit 17, in a state where the slit 17 has been formed, the submount substrate 11 is not finely divided and it is easy to move and handle the submount substrate 11. Accordingly, it is possible to simply carry out a plating formation operation to the cut surface (namely the side surface) of the first electrode layer 12. Also, there is the advantage that alignment at the time of cutting out individual submounts 1 from the submount substrate 11 is easy.

Figure 14:
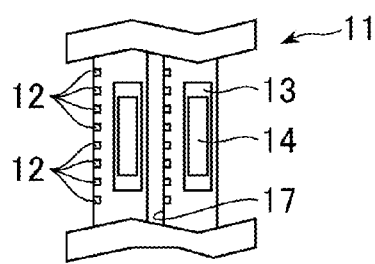
FIG. 14 is an expanded view of main parts of FIG. 13.

A partially enlarged view of the submount substrate 11 in which the slit 17 has been formed is shown in FIG. 14.

Next, plating is carried out for the side surface 122 of the first electrode layer 12 that has been exposed by the previously described cutting. As a result of this, it is possible to form a thin film (not shown) for connection of the bonding wire 4 to the side surface 122. As material for the thin film, is possible to use, for example, Ni/Au plating.

With this embodiment, there is the advantage that manufacturing efficiency is good because it is possible to form the thin-film on the side surface 122 of the plurality of first electrode layers 12 simultaneously with plating. With this embodiment, it is also possible to omit plating of the side surface 122. In this case, it is preferable to carry out electrical connection to the side surface 122 after an oxide film has been removed by plasma etching or the like.

Next, submount substrate 11 is cut to obtain individual submounts 1. This cutting can also be carried out using a so-called dicer. In this manner it is possible to obtain the submount 1 shown in FIG. 4-FIG. 6.

As has been described above, the submount 1 of this embodiment has the advantage of simple mass production while maintaining high precision. Also, since there is no bent portion in the first electrode layer 12, there is almost no possibility of fracture to the first electrode layer 12. There are therefore the advantages that it possible to keep the rate of occurrence of defects that would be removed at inspection low, and it is possible to keep manufacturing cost of the submount low.

Also, with this embodiment, when fitting an optical fiber 5 to an optical element 14 that has been mounted on a module substrate 2, it is possible to fit the optical fiber 5 with an end surface of the optical fiber 5 abutting against the surface of the sealing member 16. In this way, according to this embodiment, there is the advantage that it is possible to make a distance between the surface of the optical element 14 and an end surface of the optical fiber 5 constant without any variation. Specifically, with this embodiment, there is the advantage that it is possible to improve the uniformity of optical modules that are produced. In FIG. 8 and FIG. 9, a microscopic gap is formed between an end surface of the optical fiber 5 and the surface of the optical element 14, but in a process of deploying the optical fiber 5, it is possible to obtain the above described advantage by abutting the two.

With the above-described embodiment, the first conductive layer 12 and the second conductive layer 13 were formed using a mask pattern. However, it is possible to form these conductive films using a mechanical process. For example, it is possible to form these conductive films by first applying copper foil having a required thickness to the surface of the submount substrate 11, and then cutting/removing the copper foil by a mechanical process. Alternatively, it is possible to carry out a mechanical process after plating.

With this embodiment, in particular it is preferable to make the side surface 122 of the first conductive layer 12 sufficiently wide, and in order to do this it is preferable to make the thickness of the first conductive layer 12 sufficiently thick. In this case, if the shape of the first conductive layer 12 is formed by etching, it may be difficult to obtain sufficient processing accuracy. By contrast, according to the manufacturing method using a mechanical process, if the first conductive layer 12 is thick also, there is the advantage that processing accuracy of the first conductive layer 12 is not degraded. The mechanical process here uses a dicer or a miller, for example, but is not restricted thereto, and it is also possible to use a processing method with another form of cutting.

Second Embodiment

Next, a submount 21 of a second embodiment of the present invention will be described mainly with reference to FIG. 15 to FIG. 19. In the description of this embodiment, the same reference numerals will be used for elements that are basically common to structural elements of the previously described first embodiment, and cumbersome description will be avoided.

Figure 15:
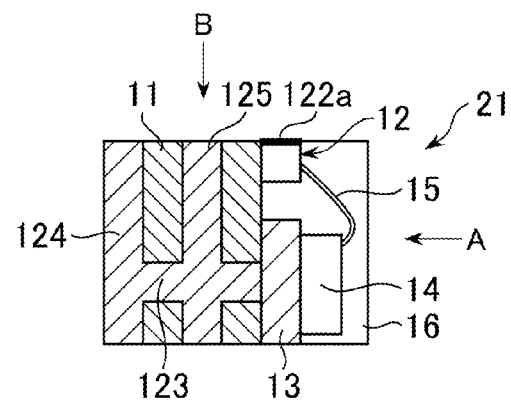
FIG. 15 is an explanatory drawing showing a submount substrate of a second embodiment of the present invention.
Figure 16:
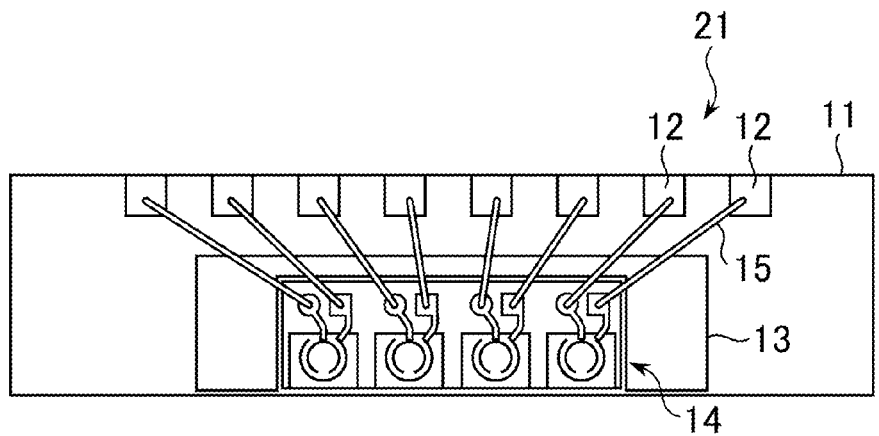
FIG. 16 is a perspective view in the direction of arrow A in FIG. 15.
Figure 17:
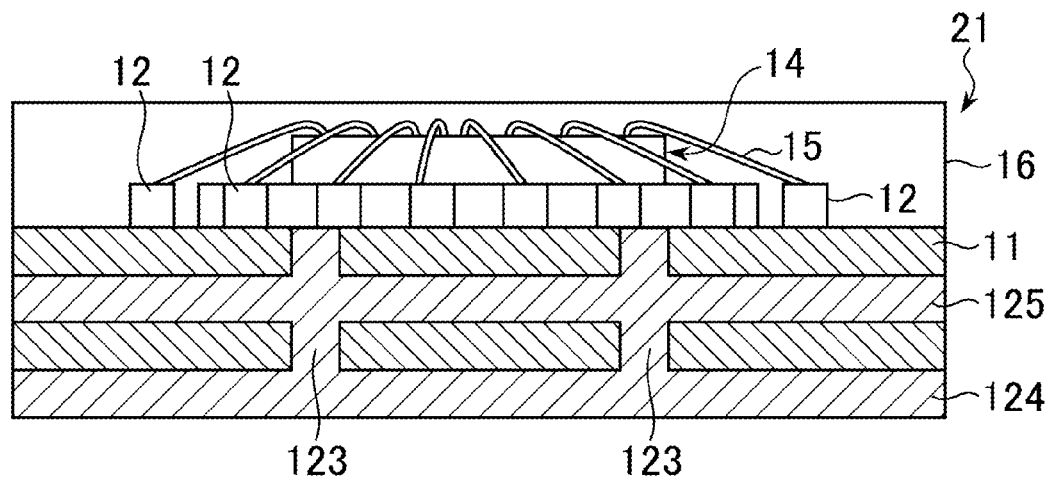
FIG. 17 is a perspective view in the direction of arrow B in FIG. 15.

The submount substrate 11 of the second embodiment is further provided with a via 123, a heat dissipator 124, and an intermediate conductive body 125 (refer to FIG. 15 to FIG. 17). Specifically, the submount substrate 11 of the second embodiment is configured as a so-called multilayer substrate.

The heat dissipator 124 is arranged on a rear surface side (left side in FIG. 15) of the submount substrate 11, in a state exposed to the outside. The via 123 connects the second electrode layer 13, on which an optical element 14 has been arranged, and the heat dissipator 124. A material having good thermal conductivity such as copper, for example, is used as the via 123. In this way, with this embodiment, the second electrode layer 13 and the heat dissipator 124 are thermally and electrically connected by means of the via 123.

According to the submount 21 of this embodiment, there is the advantage that it is possible to discharge heat generated by the optical element 14 to the outside using the heat dissipator 124.

Figure 18:
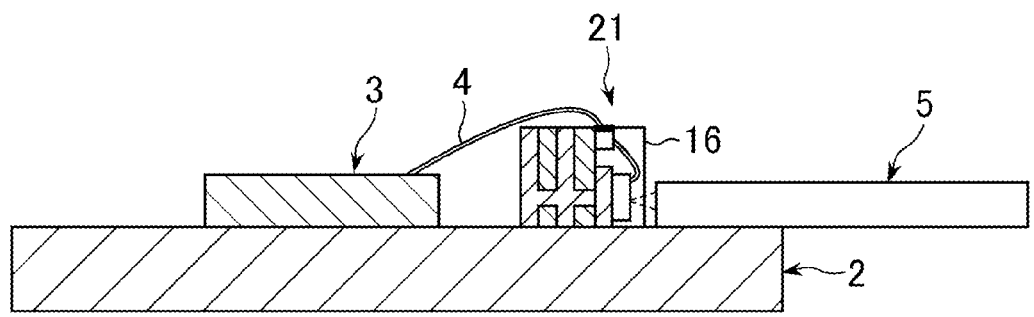
FIG. 18 is an explanatory drawing showing one example of an optical module that uses the submount substrate of the second embodiment.
Figure 19:
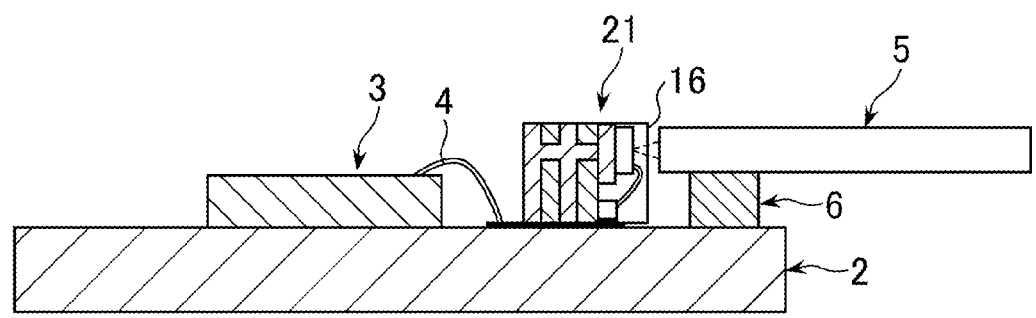
FIG. 19 is an explanatory drawing showing another example of an optical module that uses the submount substrate of the second embodiment.

The submount 21 of this embodiment, similarly to the first embodiment, can be mounted on the module substrate 2 (referred to FIG. 18 and FIG. 19).

The remaining structure and advantages of the second embodiment are basically the same as those of the previously described first embodiment, and so description of any further detail will be omitted.

Third Embodiment

Figure 20:
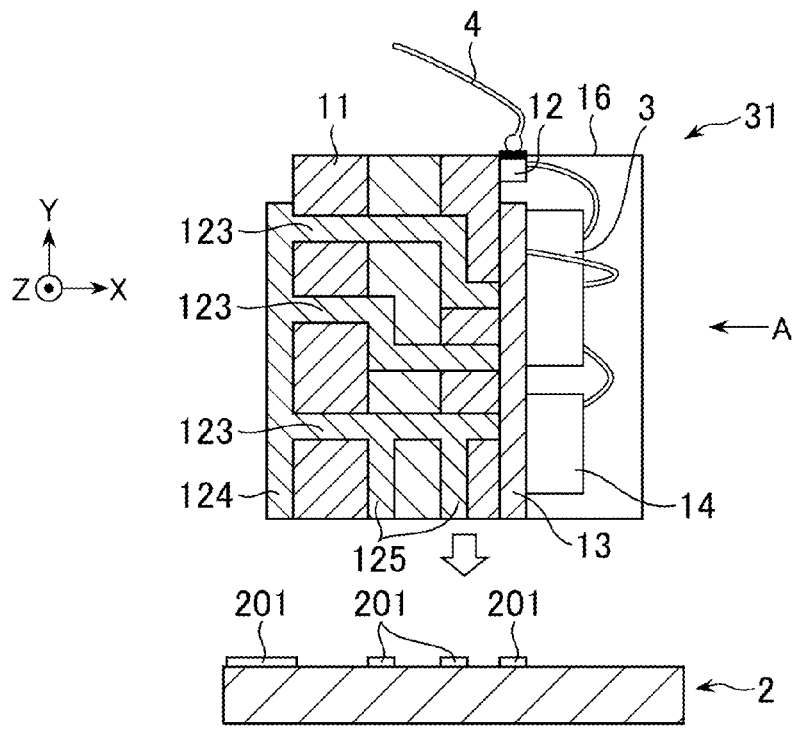
FIG. 20 is an explanatory drawing for describing a submount substrate of a third embodiment.
Figure 21:
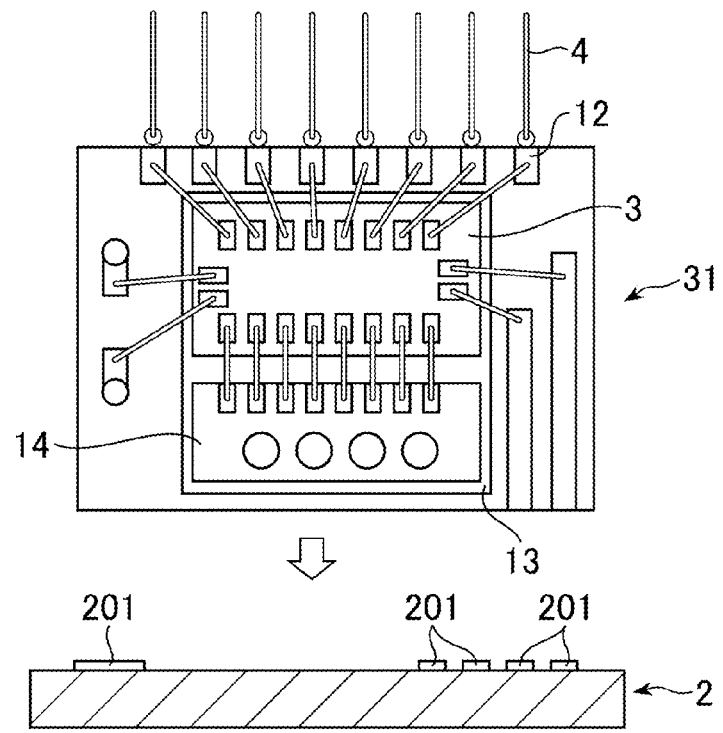
FIG. 21 is a perspective view in the direction of arrow A in FIG. 20.

A submount 31 of a third embodiment of the present invention, will be described mainly with reference to FIG. 20-FIG. 21. In the description of this embodiment, the same reference numerals will be used for elements that are basically common to structural elements of each of the previously described embodiments, and cumbersome description will be avoided.

The submount substrate 11 of the third embodiment, similarly to the second embodiment, is a so-called multilayer substrate.

Also, with the third embodiment, in addition to the optical element 14, an IC 3 is further mounted on the surface of the second electrode layer 13 of the submount substrate 11. Specifically, with the above-described embodiment an IC 3 was mounted on the surface of the module substrate 2, but with this third embodiment the IC 3 is mounted on the submount substrate 11. Also, the IC 3 and the optical element 14 are sealed by the sealing member 16 (refer to FIG. 20) together with wiring for connecting them together.

Further, with the third embodiment, an electrode 201 that has been formed on the surface of the module substrate 2, and side surfaces of the intermediate conductive body 125 and the heat dissipator 124, are connected by connection means such as solder or conductive paste, and in this way required electrical connections are carried out. Here, the bonding wire 4 of this embodiment connects an electrode (not shown) at the module substrate 2 side, and the side surface 122 of the first electrode layer 12.

With this embodiment, there is the advantage that it is possible to shorten the length of wiring for connecting the IC 3 and the optical element 14.

Also, with this embodiment, since the electrode 201 that has been formed on the surface of the module substrate 2, and side surfaces of the second electrode layer 13, the intermediate conductive body 125 and the heat dissipator 124, are connected, it is possible to increase the number of electrical connection points. Accordingly, connection points required for control of the IC 3 etc. can be increased without wire bonding, and it becomes possible to reduce the work required for mounting.

The remaining structure and advantages of the third embodiment are basically the same as those of each of the previously described embodiments, and so description of any further detail will be omitted.

Fourth Embodiment

Figure 22:
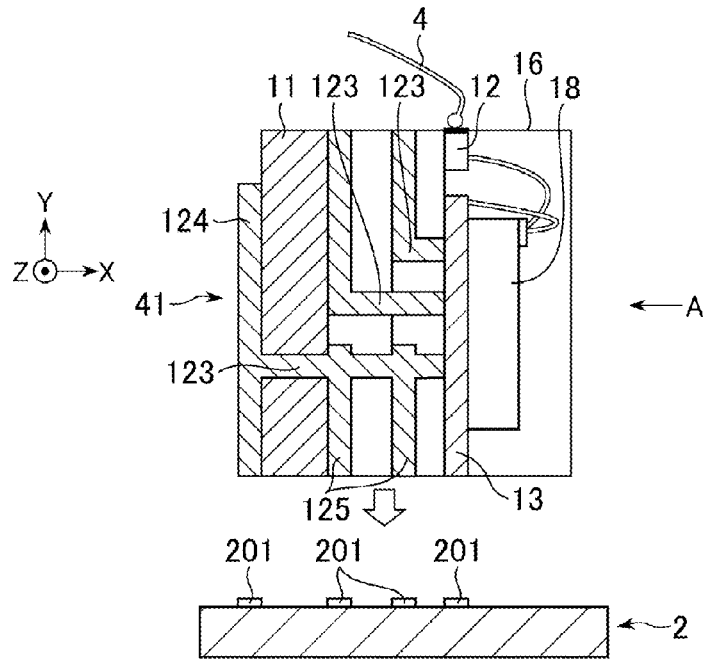
FIG. 22 is an explanatory drawing for describing a submount substrate of a fourth embodiment.
Figure 23:
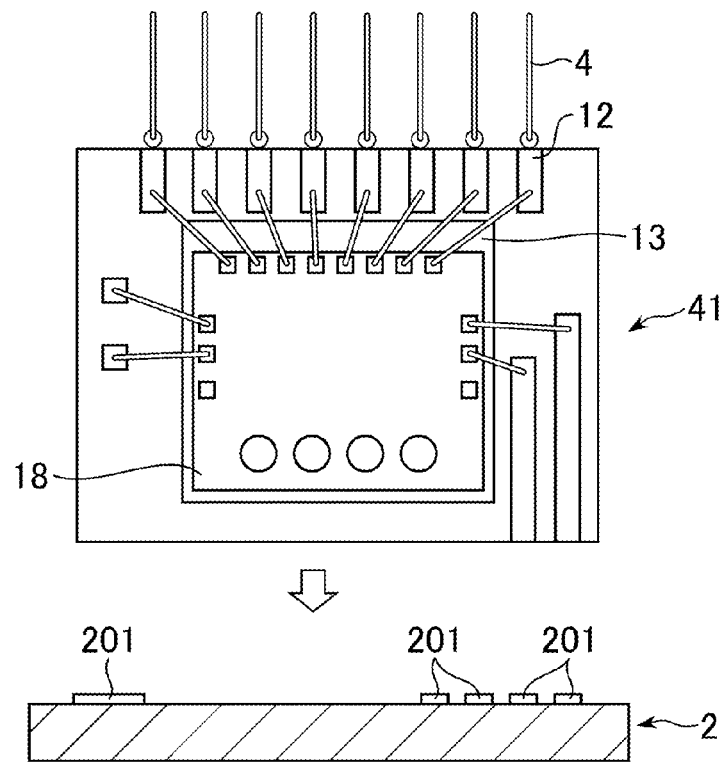
FIG. 23 is a perspective view in the direction of arrow A in FIG. 22.

A submount 41 of a fourth embodiment of the present invention, will be described mainly with reference to FIG. 22-FIG. 23. In the description of this embodiment, the same reference numerals will be used for elements that are basically common to structural elements of each of the previously described embodiments, and cumbersome description will be avoided.

The submount substrate 11 of the fourth embodiment, similarly to the second and third embodiments, is a so-called multilayer substrate.

Also, with the third embodiment, a silicon photonics IC 18 is used instead of the optical element 14 and the IC 3. The silicon photonics IC 18 is an IC into which functional sections as an optical element and functional sections as an IC for driving the optical element and amplifying signals, are integrated. The silicon photonics IC 18 is mounted on the second electrode layer 13, and sealed by the sealing member 16 (refer to FIG. 22).

In the case of the silicon photonics IC 18 there is a tendency for the number of connection points required for connection to the substrate to be large. With this embodiment, as well as connection using wire bonding, it is also possible to connect to the electrode 201 of the module substrate 2 using each of the side surfaces of the second electrode layer 13, the intermediate conductive body 125, and the heat dissipator 124, which gives an advantage that it is possible to miniaturize the overall module.

The remaining structure and advantages of the fourth embodiment are basically the same as those of each of the previously described embodiments, and so description of any further detail will be omitted.

Fifth Embodiment

Figure 24:
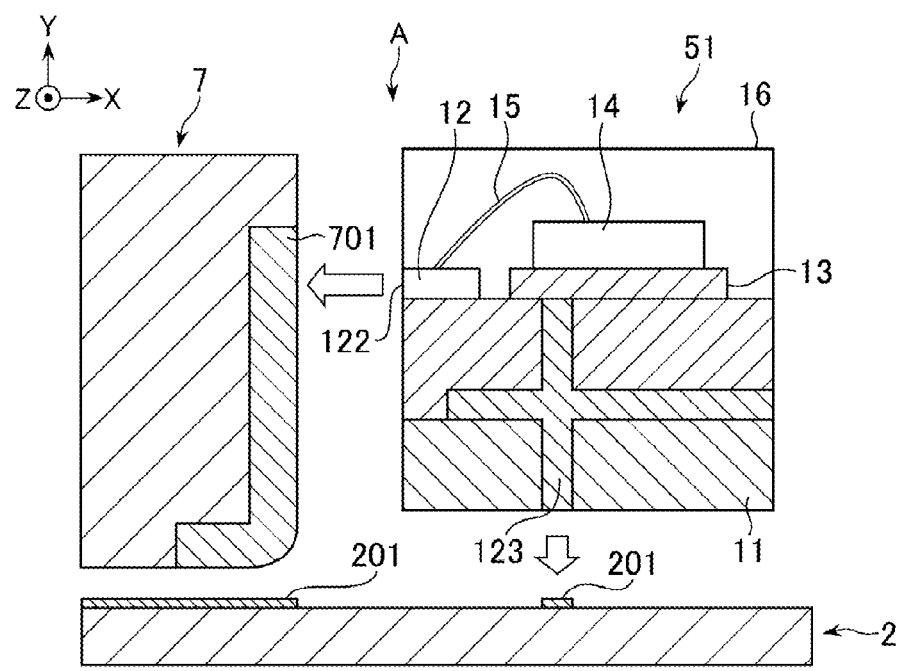
FIG. 24 is an explanatory drawing for describing a submount substrate of a fifth embodiment.
Figure 25:
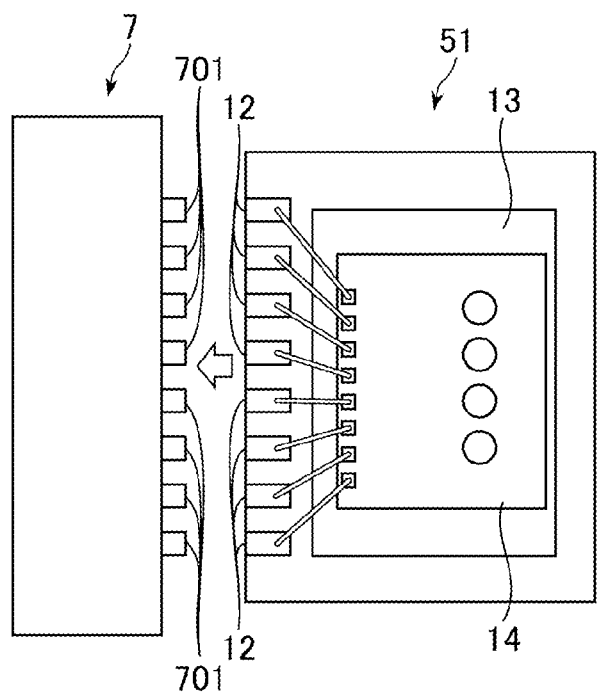
FIG. 25 is a perspective view in the direction of arrow A in FIG. 24.

Next, a submount 51 of a fifth embodiment of the present invention will be described mainly with reference to FIG. 24 and FIG. 25. In the description of this embodiment, the same reference numerals will be used for elements that are basically common to structural elements of each of the previously described embodiments, and cumbersome description will be avoided.

The submount substrate 11 of the fifth embodiment, similarly to the second to fourth embodiments, is a so-called multilayer substrate. However, with the fifth embodiment the heat dissipator has been omitted.

Also, with the fifth embodiment, similarly to the second and third embodiments, the optical element 14 is mounted on the surface of the second electrode layer 13.

With the fifth embodiment, an end surface (lower surface in FIG. 24) of the via 123 of the submount substrate 11 is connected to the electrode 201 of the module substrate 2 by appropriate connection means such as solder.

Further, with the fifth embodiment, the side surface 122 of the first electrode layer 12 is directly connected to an electrode 701 of a semiconductor package 7. That is, with this embodiment, the electrode 701 and the first electrode layer 12 are connected without using wire bonding.

The semiconductor package 7 is mounted on the surface of the module substrate 2. Also, with this semiconductor package 7 the electrode 701 is formed on the side surface. It is possible to use, for example, a QFN (Quad Flat Non-leaded Package) as this semiconductor package 7.

In the case where QFN is used as the semiconductor package, it is possible to obtain the following advantage.
- since it is possible to reduce or completely do away with the number of wires required for wiring, this contributes to miniaturization of the optical modules;
- by reducing the number of wires, impedance matching is made easy and high-frequency performance can be improved.

The remaining structure and advantages of the fifth embodiment are basically the same as those of each of the previously described embodiments, and so description of any further detail will be omitted.

Sixth Embodiment

Figure 26:
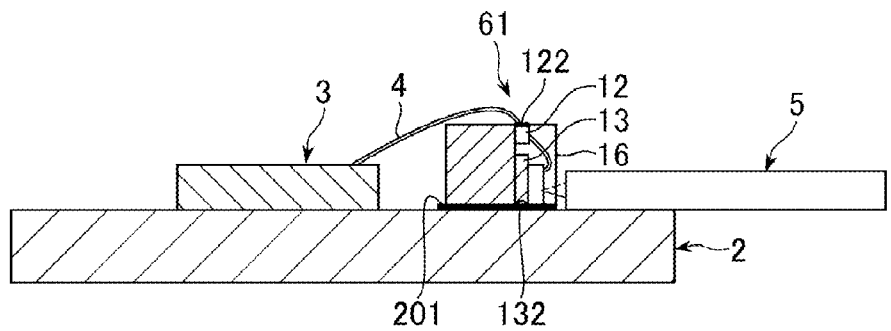
FIG. 26 is an explanatory drawing for describing a submount substrate of a sixth embodiment.
Figure 27:
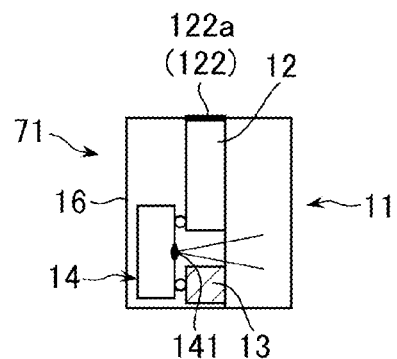
FIG. 27 is an explanatory drawing for describing a submount substrate of a seventh embodiment.
Figure 28:
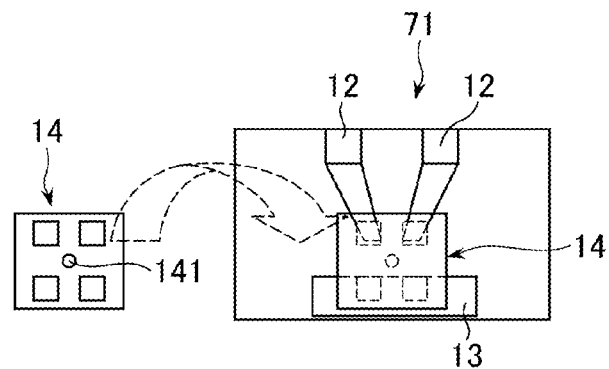
FIG. 28 is an explanatory drawing for describing a method of mounting an optical element on the submount substrate of FIG. 27.

A submount 61 of a sixth embodiment of the present invention, will be described mainly with reference to FIG. 26. In the description of this embodiment, the same reference numerals will be used for elements that are basically common to structural elements of each of the previously described embodiments, and cumbersome description will be avoided.

The structure of the submount 61 of the sixth embodiment is basically the same as the structure of the submount 1 shown in FIG. 8. However, with the sixth embodiment, a side surface 132 of the second electrode layer 13 is directly connected to the electrode 201 formed on the surface of the module substrate 2. In this way, with the sixth embodiment, it is possible to electrically connect the second electrode layer 13 and the module substrate 2.

Further, with the sixth embodiment, there is the advantage that heat generated by the optical element 14 can be discharged to the outside by means of the second electrode layer 13 and the electrode 201.

The remaining structure and advantages of the sixth embodiment are basically the same as those of each of the previously described embodiments, and so description of any further detail will be omitted.

Seventh Embodiment

A submount 71 of a seventh embodiment of the present invention, will be described mainly with reference to FIG. 27 to FIG. 30. In the description of this embodiment, the same reference numerals will be used for elements that are basically common to structural elements of each of the previously described embodiments, and cumbersome description will be avoided.

The submount substrate 11 of the seventh embodiment is substantially transparent with respect to light of a wavelength used. Also, with the seventh embodiment, an incoming or outgoing light point 141 of the optical element 14 is arranged facing the transparent submount substrate 11.

Figure 29:
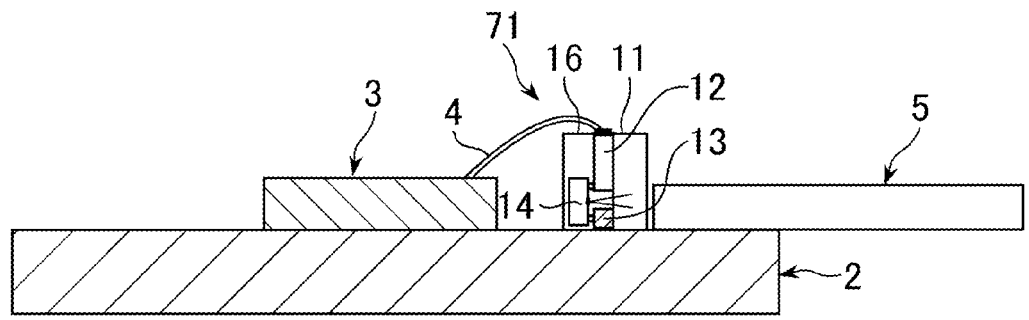
FIG. 29 is an explanatory drawing showing one example of an optical module that uses the submount substrate of FIG. 27.
Figure 30:
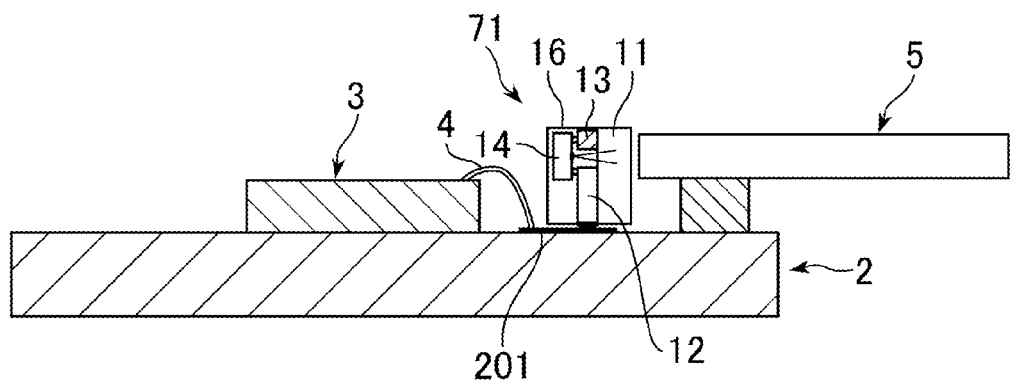
FIG. 30 is an explanatory drawing showing another example of an optical module that uses the submount substrate of FIG. 27.
Figure 31:
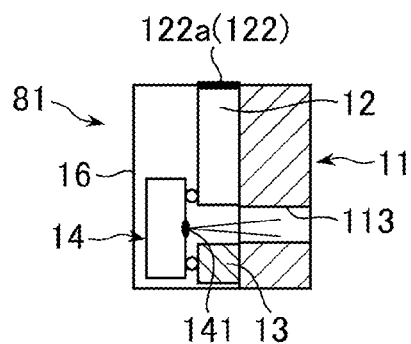
FIG. 31 is an explanatory drawing for describing a submount substrate of an eighth embodiment.
Figure 32:
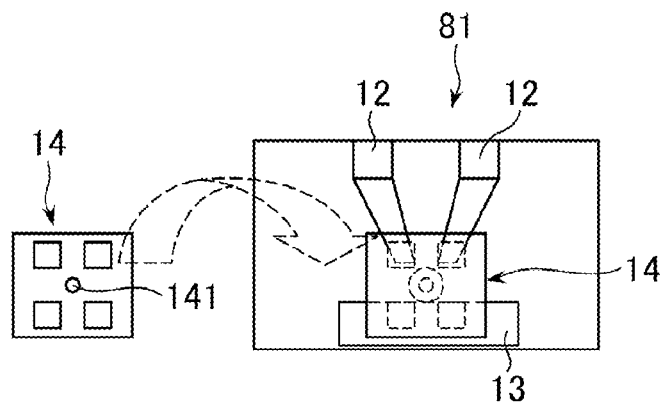
FIG. 32 is an explanatory drawing for describing a method of mounting an optical element on the submount substrate of FIG. 31.

The submount 71 of this embodiment, similarly to the above-described embodiment, can be attached to the module substrate 2 (refer to FIG. 29 and FIG. 30). With this embodiment, light that has passed through the submount substrate 11 is received by the optical element 14, or light that has been generated by the optical element 14 can be transmitted through the submount substrate 11.

The remaining structure and advantages of the seventh embodiment are basically the same as those of each of the previously described embodiments, and so description of any further detail will be omitted.

Eighth Embodiment

Next, a submount 81 of an eighth embodiment of the present invention will be described mainly with reference to FIG. 31 to FIG. 34. In the description of this embodiment, the same reference numerals will be used for elements that are basically common to structural elements of each of the previously described embodiments, and cumbersome description will be avoided.

A through hole 113 for passing light is formed in the submount substrate 11 of the eighth embodiment. Also, with the eighth embodiment, an incoming or outgoing light point 141 of the optical element 14 is arranged facing the through hole 113.

Figure 33:
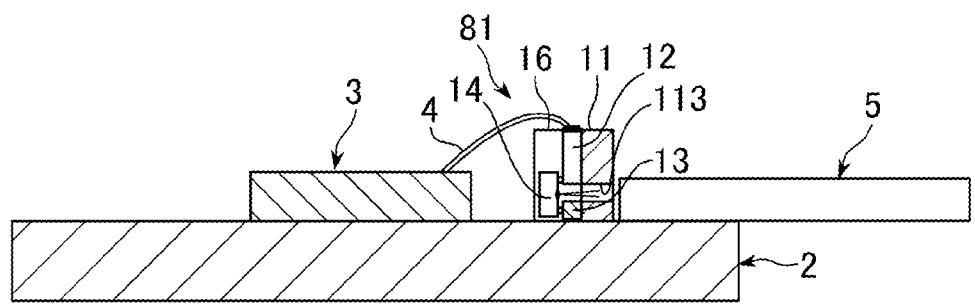
FIG. 33 is an explanatory drawing showing one example of an optical module that uses the submount substrate of FIG. 31.
Figure 34:
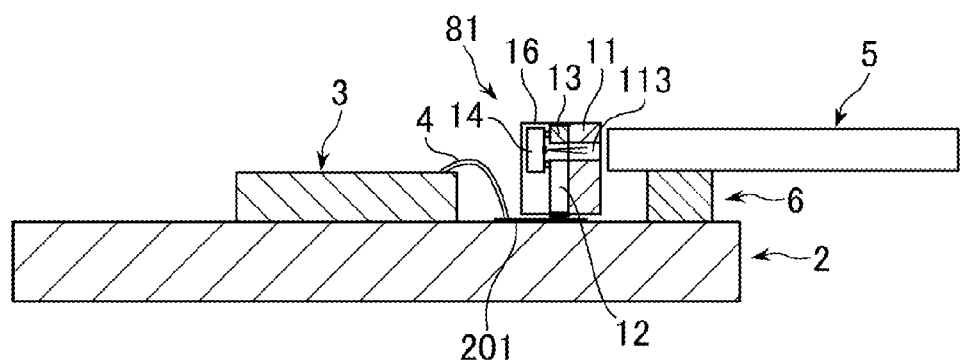
FIG. 34 is an explanatory drawing showing another example of an optical module that uses the submount substrate of FIG. 31.

The submount 81 of this embodiment, similarly to the above-described embodiment, can be attached to the module substrate 2 (refer to FIG. 33 and FIG. 34). With this embodiment, light that has passed through the through hole 113 of the submount substrate 11 can be received by the optical element 14. Alternatively, light generated by the optical element 14 can be sent out externally, for example, to an optical fiber 5, by means of the through hole 113 of the submount substrate 11.

The remaining structure and advantages of the eighth embodiment are basically the same as those of each of the previously described embodiments, and so description of any further detail will be omitted.

Ninth Embodiment

Next, a manufacturing method for a submount 91 of a ninth embodiment of the present invention, will be described mainly with reference to FIG. 35 to FIG. 36. In the description of this embodiment, the same reference numerals will be used for elements that are basically common to structural elements of each of the previously described embodiments, and cumbersome description will be avoided.

First, with reference to FIG. 35, a detailed manufacturing method for the submount 1 of the first embodiment will be described.

With the first embodiment that has already been described, a side surface of the submount substrate 11 is subjected to cutting processing, to expose a side surface 122 of the first electrode layer 12 to the outside (refer to FIG. 35(a)).

Next, although description was omitted previously, the side surface 122 of the first electrode layer 12 is etched to a shallow depth, to remove waste that has adhered to the side surface 122 (refer to FIG. 35(b)).

Next, a thin-film 122a formed of Ni/Au plate is formed on the side surface 122 (refer to FIG. 35 (c)). Wire bonding is simplified by this thin-film.

However, with this manufacturing method, when forming the thin film 122a on the side surface 122 of the first electrode layer 12, a thin film (shown by reference character P in FIG. 35(c)) also grows in a side surface direction (in the upward direction in FIG. 35(c)) of a thin-film 121a formed on the surface 121 of the first electrode layer 12. The thin-film 121a is also formed of Ni/Au plate. If this happens, a step arises in the formed thin-film, and there is a possibility of difficulties arising in a wire bonding operation. In order to reliably prevent the occurrence of a step, it can be considered to devise a mask shape at the time of plating. Alternatively, it is also possible to carry out processing to remove this step after the step has been formed. However, there is a possibility that this type of operation will raise the processing cost.

Also, as shown in FIG. 35(a), if the side surface 122 of the first electrode layer 12 and an end surface of the thin-film 121a are at the same position, then at the time of cutting the submount substrate 11 the thin-film 121a may be drawn out to partially cover the side surface 122. In this type of situation, if etching processing is carried out to the side surface 122, processing rate will differ depending on the material, and microscopic irregularities will be formed on the side surface 122. If this happens, irregularities will occur on the surface of the thin film 122a that is finally formed, and there is a danger of increasing the occurrence of contact failures in a wire bonding process.

With this ninth embodiment, therefore, an end section of the thin-film 121a formed on the surface 121 of the first electrode layer 12 is divided from the side surface 122 of the first electrode layer 12 (referred to FIG. 36(a)). This can be implemented comparatively easily and at low-cost by devising a mask shape for forming the thin-film 121a. Operations after that are the same as the example of FIG. 35 (referred to FIG. 36(b) and (c)).

By doing this, it is possible to prevent the occurrence of a step at the side surface side of the first electrode layer 12, and there is the advantage that it is useful in reducing the processing cost of the submount.

Also, with the ninth embodiment, since the side surface 122 of the first electrode layer 12 and an end section of the thin-film 121a are divided, at the time of cutting the submount substrate 11, side surface 122 is not partially covered by the thin-film 121a. Accordingly, according to this ninth embodiment, there is the advantage that it is possible to reduce the possibility of contact failures in the wire bonding process.

Further, by improving the uniformity of the side surface 122 of the first electrode layer 12, there are the following advantages.

- in order to process the submount 1, a nozzle of a die bonder or a mounter is vacuum contacted with the side surface 122. At this time, if uniformity of the side surface 122 is high, the vacuum contact can be carried out reliably.
- as shown in FIG. 9, when the side surface 122 is connected to the module substrate 2, if the side surface 122 projects it is easy for the submount substrate 11 to be inclined. Conversely, if the side surface 122 is formed uniformly, the submount substrate 11 is not inclined and assembly becomes easy.
- with the implementation example such as in FIG. 9, the side surface 122 is connected to the electrode 201 of the module substrate 2. In this case, if the side surface 122 has uniformity, it is possible to increase the reliability of junctions between the electrode 201 and the side surface 122 that use conductive paste or solder.

The remaining structure and advantages of the ninth embodiment are basically the same as those of each of the previously described embodiments, and so description of any further detail will be omitted.

FIG. 37 shows a submount 101 of a tenth embodiment of the present invention. With this example, the first electrode layer 12 is formed using a via. Specifically, the first electrode layer 12 this embodiment is provided with an extended section 122b formed from a via, and a land section 122c for the via.

With this embodiment, it is possible to make the side surface of the extended section 122b large in area. Accordingly, it is possible to reduce the resistance of connection points by carrying out electrical connection using this side surface.

Here, as the via for forming the extended section 122b, it is possible to use a through hole via where a hole is formed in an axial direction, or to use a via that is internally filled with a conductive material. Alternatively, as the via it is possible to internally fill a conductive material, in which a hole is formed in the axial direction, with a non-conductive material.

Reference numeral 1011 in FIG. 37 shows a dummy pattern for stabilizing orientation of a submount placed on a component.

The remaining structure and advantages of this embodiment are basically the same as those of the previously described first embodiment, and so description of any further detail will be omitted.

The content of the present invention is not limited to each of the above-described embodiments. It will be understood that various modifications may be added to the present invention with respect to the specific structure, within the scope of the appended patent claims.

For example, although with the embodiments the second electrode layer 13 and the optical element 14 are electrically connected, it is also possible to have them not electrically connected depending on the structure of an electrode of the optical element 14. Also, it is possible to omit formation of the second electrode layer itself.

DESCRIPTION OF THE REFERENCE NUMERALS 1, 21, 31, 41, 51, 61, 71, 81, 91 Submount
11 submount substrate
111 surface of submount substrate
112 side surface of submount substrate
113 through hole
12 first electrode layer
121 surface of first electrode layer
122 side surface of first electrode layer
123 via
124 heat dissipator
125 intermediate conductor
13 second electrode layer
131 surface of second electrode layer
132 side surface of second electrode layer
14 optical element
141 incoming or outgoing light point
15 bonding wire
16 sealing member
17 slit
18 silicon photonics IC
2 module substrate
201 electrode of module substrate
3 IC (corresponding to drive element for driving an optical element, or an amplifying element for amplifying output from the optical element)

4 bonding wire
5 optical fiber
6 base
7 semiconductor package
701 electrode of semiconductor package

The invention claimed is:

1. A manufacturing method for a submount, comprising the following steps:
   (1) a step of laminating a first conductive layer on a surface of a submount substrate;
   (2) a step of forming the first conductive layer in a predetermined shape using a mask pattern or machining;
   (3) a step of forming a thin film on a surface of the first conductive layer;
   (4) a step of sealing the surface of the submount substrate including the surface of the first conductive layer and a surface of an optical element using a sealing member, wherein the optical element is disposed on the substrate and electrically connected to the first conductive layer via a bonding wire; and
   (5) a step of forming a side surface, that is formed on substantially the same plane as a side surface of the submount substrate and has been exposed to the outside of the submount substrate, on the first conductive layer, by cutting the first conductive layer in the thickness direction together with the submount substrate, wherein the thin film is formed on the surface of the first conductive layer to be cut and is bonded to the bonding wire;
   wherein an end section of the thin film formed on the first conductive layer is disposed at a place separated from the side surface of the first conductive layer which is exposed to the outside, and
   wherein the first conductive layer is not covered by the thin film from the end section of the thin film to the side surface of the first conductive layer, so that the thin film formed on the first conductive layer is not cut together with the first conductive layer.

2. A manufacturing method according to claim 1, further comprising,
   after step (5), applying etching treatment for cleaning on the side surface of the first conductive layer, and then forming a thin film on the side surface of the first conductive layer in order to carry out electrical connection from the outside to the first conductive layer.

* * * * *